US009336869B2

(12) United States Patent
Chung et al.

(10) Patent No.: US 9,336,869 B2
(45) Date of Patent: May 10, 2016

(54) NONVOLTILE RESISTANCE MEMORY AND ITS OPERATION THEREOF

(71) Applicant: NATIONAL CHIAO TUNG UNIVERSITY, Hsinchu City (TW)

(72) Inventors: Steve S. Chung, Hsinchu (TW); E-Ray Hsieh, Kaohsiung (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/809,280

(22) Filed: Jul. 27, 2015

(65) Prior Publication Data
US 2016/0027507 A1    Jan. 28, 2016

Related U.S. Application Data

(60) Provisional application No. 62/029,582, filed on Jul. 28, 2014.

(51) Int. Cl.
| G11C 13/00 | (2006.01) |
| H01L 45/00 | (2006.01) |
| H01L 27/24 | (2006.01) |
| H01L 29/51 | (2006.01) |

(52) U.S. Cl.
CPC .......... *G11C 13/0007* (2013.01); *G11C 13/004* (2013.01); *G11C 13/0026* (2013.01); *G11C 13/0028* (2013.01); *G11C 13/0069* (2013.01); *H01L 27/2436* (2013.01); *H01L 27/2463* (2013.01); *H01L 29/51* (2013.01); *H01L 29/517* (2013.01); *H01L 45/08* (2013.01); *H01L 45/1233* (2013.01); *H01L 45/1253* (2013.01); *H01L 45/146* (2013.01); *G11C 2013/009* (2013.01); *G11C 2013/0045* (2013.01)

(58) Field of Classification Search
CPC ............... G11C 13/004; G11C 13/007; G11C 13/0026; G11C 13/0028; G11C 13/0069; G11C 2013/009; G11C 2013/0045; H01L 27/2346; H01L 27/2463; H01L 29/51; H01L 29/517; H01L 45/08; H01L 45/146; H01L 45/1233; H01L 45/1253
USPC .......................................... 365/148, 158, 163
See application file for complete search history.

(56) References Cited

U.S. PATENT DOCUMENTS

| 6,940,740 B2 * | 9/2005 | Ueda ....................... G11C 11/22 257/E21.664 |
| 2005/0094457 A1 * | 5/2005 | Chen ...................... G11C 11/22 365/222 |

* cited by examiner

*Primary Examiner* — Tan T. Nguyen
(74) *Attorney, Agent, or Firm* — CKC & Partners Co., Ltd.

(57) ABSTRACT

A memory cell and the associated array circuits are disclosed. The memory array circuit includes a plurality of memory units, in which each of the memory units includes a storage device and a field-effect transistor. The storage device includes a top electrode, a bottom electrode and an oxide-based dielectric layer. The top electrode is formed by metal or metallic oxide dielectrics and connected to a word line. The bottom electrode is formed by metal, and the oxide-based dielectric layer is placed between the top electrode and the bottom electrode. The field-effect transistor includes a gate terminal connected to the bottom electrode, a source terminal connected to a ground line, and a drain terminal connected to a bit line. The resistance of the storage device is configured to be adjusted according to a first voltage applied to the word line and a second voltage applied to the bit line.

21 Claims, 7 Drawing Sheets

NONVOLTILE RESISTANCE MEMORY AND ITS OPERATION THEREOF

RELATED APPLICATIONS

This application claims priority under U.S. Provisional Application No. 62/029,582 filed Jul. 28, 2014, which is herein incorporated by reference.

BACKGROUND

1. Technical Field

The present disclosure relates to a semiconductor device. More particularly, the present disclosure relates to a nonvolatile memory cell.

2. Description of Related Art

Recently, a nonvolatile semiconductor storage device called resistance random access memory (ReRAM) has received more attention. This storage element is a metal-insulator-metal (MIM) structure formed by sandwiching a so called transition metal oxide (TMO) between a top electrode and a bottom electrode. A ReRAM is used as a memory element via the changing of the element into two states, such as "0" and "1", depending on the two resistance states, in terms of the low resistance state or high resistance state. A process to change the element from the high resistance state to the low resistance state is called a SET process, and a process of changing from the low resistance state to the high resistance state is called a RESET process. Data can be read by measuring the magnitude of the current flowing through the resistance storage element which represents high current flow (low resistance) or low current (high resistance).

In an ReRAM, to prevent the resistance storage element from being damaged when a large current flows through the element, a diode or transistor or any other suitable device is used to limit the current. On the other hand, in order to scale the memory size, people used different strategies to minimize the storage size, e.g., the cross-bar array with diodes to limit the current. To meet the high current requirements in the forming of the large ReRAM array, diodes, bipolar transistors, or MOSFETs are used for the memory element.

SUMMARY

A single transistor and one MIM will be able to solve the aforementioned issues. One aspect of the present disclosure is a memory array circuit. The memory array circuit includes a plurality of memory units, in which each of the memory units includes a storage device and a field-effect transistor (FET).

The storage device includes a top electrode, a bottom electrode and an oxide-based dielectric layer. The top electrode is formed by metal or metallic oxide dielectrics and connected to a word line. The bottom electrode is formed by metal, and the oxide-based dielectric layer is deposited between the top electrode and the bottom electrode.

The field-effect transistor includes a gate terminal connected to the bottom electrode of the storage device; a source terminal connected to a ground line, a drain terminal connected to a bit line, and a channel between the gate terminal, the source terminal and the drain terminal. The resistivity of the storage device is configured to be adjusted according to a first voltage applied to the word line and a second voltage applied to the bit line.

Another aspect of the present invention is a memory array circuit. The memory array circuit includes a plurality of word lines, a plurality of bit lines, a word line driver connected to the word lines, a bit line driver connected to the bit lines, and a ground line and a plurality of memory units.

Each of the memory units includes a storage device and a field-effect transistor (FET). The storage device includes a top electrode, a bottom electrode and an oxide-based dielectric layer. The top electrode is formed by metal or metallic oxide dielectrics and connected to the corresponding word line. The bottom electrode is formed by metal, and the oxide-based dielectric layer is disposed between the top electrode and the bottom electrode.

The field-effect transistor includes a gate terminal connected to the bottom electrode of the storage device, a source terminal connected to the ground line, and a drain terminal connected to the corresponding bit line. The resistivity of the storage device is configured to be adjusted according to a first voltage applied to the corresponding word line and a second voltage applied to the corresponding bit line.

The simplicity in the memory structure makes it much easier to be integrated into the current logic CMOS process and be more useful for embedded applications.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
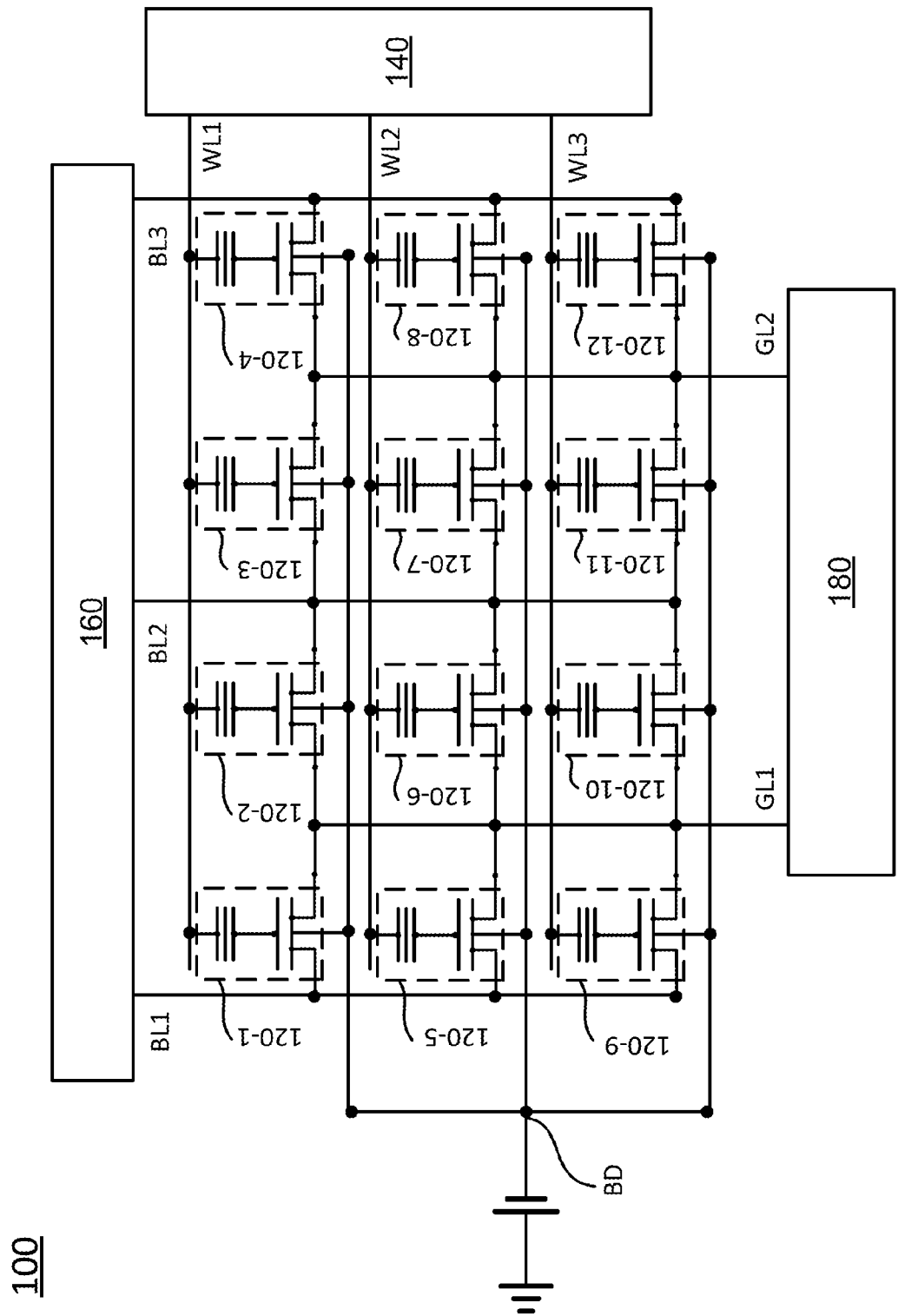
FIG. 1 is a circuit diagram illustrating a memory array circuit according to an embodiment of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a circuit diagram illustrating a memory array circuit 100 according to an embodiment of the present disclosure. As shown in FIG. 1, the memory array circuit 100 includes word lines WL1, WL2 and WL3, bit lines BL1, BL2 and BL3, a word line driver 140 connected to the word lines WL1~WL3; a bit line driver 160 connected to the bit lines BL1~BL3, ground lines GL1 and GL2 connected to a common source 180, and memory units 120-1, 120-2 . . . and 120-12.

In the present embodiment, the word line driver 140 and the bit line driver 160 are configured to drive the word line WL1~WL3 and the bit line BL1~BL3 respectively.

The memory units 120-1~120-4 are connected to the word line WL1, the memory units 120-5~120-8 are connected to the word line WL2, and the memory units 120-9~120-12 are connected to the word line WL3. In addition, memory units 120-1, 120-5, and 120-9 are connected to the bit line BL1, the memory units 120-2~120-3, 120-6~120-7, and 120-10~120-11 are connected to the bit line BL2, and the memory units 120-4, 120-8, and 120-12 are connected to the bit line BL3. A common body terminal BD is optionally connected to the memory units 120-1~120-12.

Figure 2:
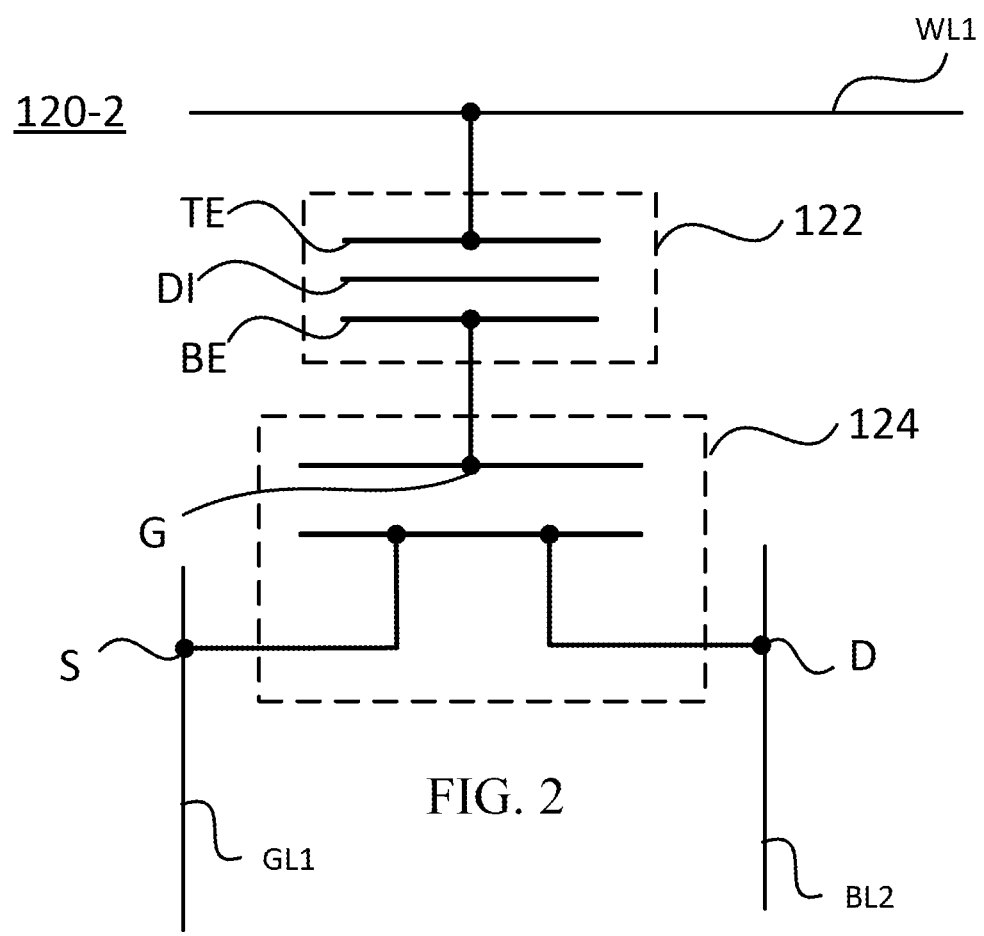
FIG. 2 is a circuit diagram illustrating the detail of memory units according to an embodiment of the present disclosure.

FIG. 2 is a circuit diagram illustrating the detail of the memory unit 120-2 according to an embodiment of the present disclosure. It is noted that the memory unit 120-1~120-12 have similar structures, and the memory unit 120-2 is taken as an example to explain the detail of the memory units 120-1~120-12.

As shown in FIG. 2, the memory unit 120-2 includes a storage device 122 and a field-effect transistor 124 respectively. For example, the storage device 122 includes a top electrode TE, a bottom electrode BE, and an oxide-based dielectric layer DI, placed between the top electrode TE and the bottom electrode BE. The storage device 122 is configured to store information by exhibiting changeable, resistance or conductivity.

The field-effect transistor 124 includes a gate terminal G, a source terminal S and a drain terminal D. The gate terminal G is connected to the bottom electrode BE of the storage device 122. The source terminal S is connected to the ground line GL1. The drain terminal D is connected to the bit line BL2.

Figure 3:
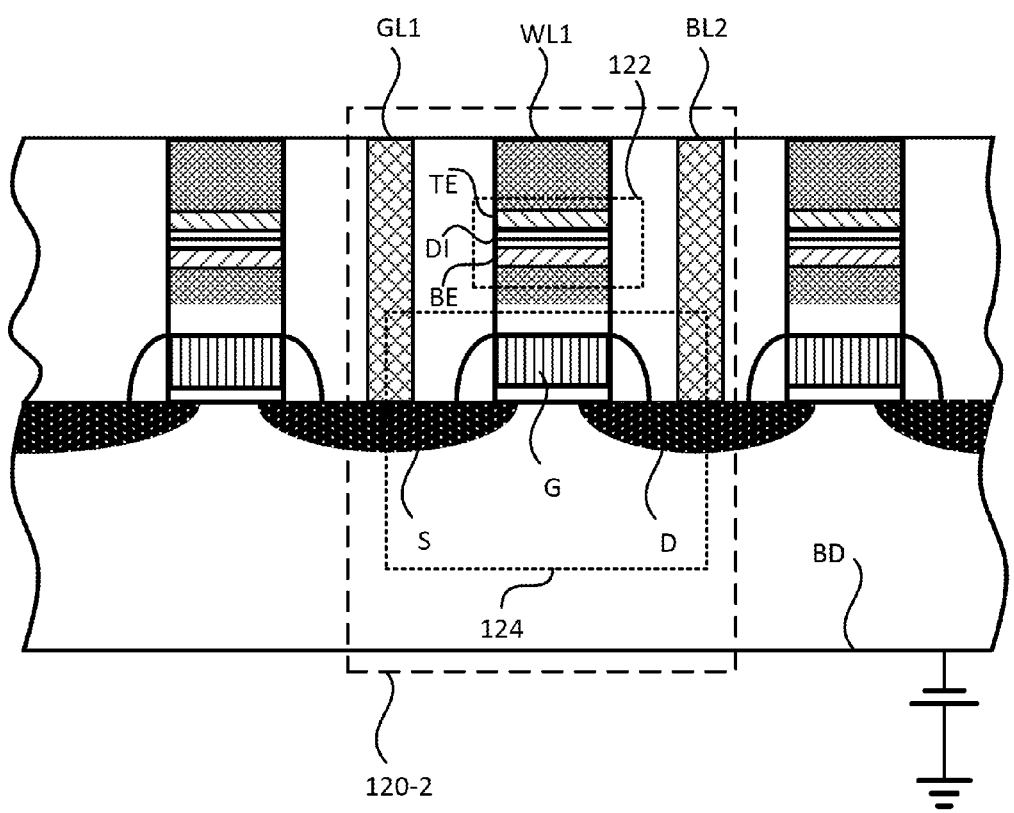
FIG. 3 is a schematic diagram illustrating the structure of memory units according to an embodiment of the present disclosure.

Additional reference is made to FIG. 3 in accordance with FIG. 2. FIG. 3 is a schematic diagram illustrating the structure of the memory unit 120-2 according to an embodiment of the present disclosure. As shown in FIG. 3, the top electrode TE is formed by metal or metallic oxide dielectrics and is connected to the word line WL1 of the memory array circuit 100. The bottom electrode BE is formed by metal. Alternatively stated, the top electrode TE, the bottom electrode BE, and the oxide-based dielectric layer DI placed between the top electrode TE and the bottom electrode BE form the structure of the storage device 122, which is also called MIM (Metal-Insulator-Metal).

In one embodiment of the present disclosure, top electrode TE and the bottom electrode BE are formed by at least one layer of a noble metal or a noble metallic compound formed with metal and oxygen in the form of oxide ion. The oxide-based dielectric layer DI is configured to change the stored value by moving ions in dielectric as voltage difference applied on the storage device. The oxide-based dielectric layer DI includes at least one layer of noble oxides or noble semiconductor-oxide compounds or noble metal-oxide compounds or noble metal-semiconductor-oxide compounds.

It is noted that the resistance of the storage device 122 of the memory unit 120-2 is configured to be adjusted according to a first voltage V1 applied to the corresponding word line WL1 and a second voltage V2 applied to the corresponding bit line BL2. Similarly, the resistance of the storage devices 122 of the memory units 120-1~120-12 is configured to be adjusted according to the voltage applied to the corresponding word line WL1~WL3 and the voltage applied to the corresponding bit line BL1~BL3.

Alternatively stated, memory units 120-1~120-12 of the present disclosure is a memory device configured to change the resistivity, conductivity, or conducting current of the storage device 122 (i.e., MIM) by applying the voltage between terminals of the device such that the memory units 120-1~120-12 are able to output with a low current or high current from the drain terminal D of the field-effect transistor 124 via the switching of MIM resistance.

Although the field-effect transistor 124 may be an n-channel metal-oxide-semiconductor field-effect transistor (n-channel MOSFETs) as shown in FIG. 1 and FIG. 2, it will be understood that the embodiments are not intended to limit the disclosure. It will be apparent to those skilled in the art that the field-effect transistor 124 may also be implemented by other types of field-effect transistor, such as a p-channel metal-oxide-semiconductor field-effect transistor (p-channel MOSFET), an n-type or a p-type junctionless MOSFET, an electron-conducting tunnel FET, a hole-conducting tunnel FET, or a trigate MOSFET (or FinFET) without limiting the scope or concept of the disclosure. It is noted that dielectric capacitances in the field-effect transistor may be featured in at least one layer of $SiO_2$ or SiON or $HfO_2$-based or other noble high-K gate dielectrics.

Figure 4A:
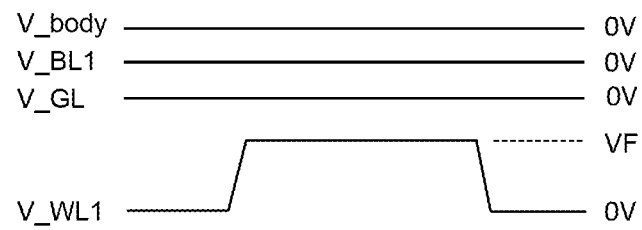
FIG. 4A~FIG. 4C are waveform diagrams illustrating the operation method of the memory unit according to an embodiment of the present disclosure.
Figure 4B:
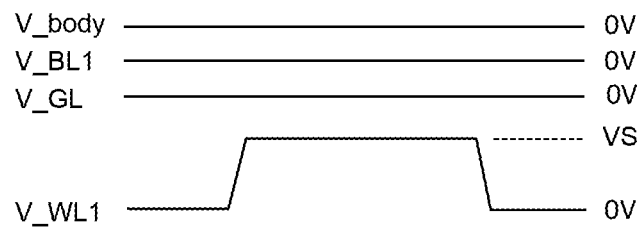
Figure 4C:
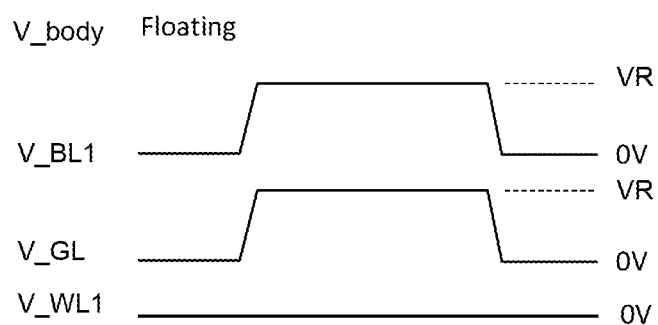

Reference is made to FIG. 4A~FIG. 4C. FIG. 4A~FIG. 4C are signal-waveform diagrams illustrating the operation method of the memory unit 120-1~120-12 according to an embodiment of the present disclosure.

In the present embodiment, the storage device 122 is configured to apply a writing voltage difference between the corresponding word line WL1~WL3 and the corresponding bit line BL1~BL3 such that the resistance or conductivity is changed to a value representative of the stored information to be written in the storage device 122.

First, to change the resistance state of the storage device 122 (i.e., MIM), the corresponding bit line (e.g., bit line BL1) and the corresponding word line (e.g., word line WL1) of the target memory unit (e.g., memory unit 120-1) will be selected. In the embodiment of an MOSFET with an n-channel, a positive bias is applied on the corresponding word line WL1 and a negative bias (or zero voltage) is applied on the corresponding bit line BL1. It is noted that in some embodiment with the body terminal BD of the transistor exists, the body terminal may be grounded or back-biased.

The forming process is shown in FIG. 4A. In some embodiment, the PRESET (i.e., forming process) is needed for the memory units 120-1~120-12 depending on the structure and thickness of the insulator (e.g., transition metal oxide, TMO) in the storage device 122 (i.e., MIM). For reasons of the constituents of TMO insulator, sometimes the forming is required, i.e., to form a filament for the conduction. By applying a voltage on the word line (e.g., WL1) which is connected to the top electrode TE of the memory unit 120, applying a voltage on the bit line (e.g., BL1), and connecting the body terminal BD to the ground line GL, the voltage difference across the memory element 120 renders the storage device 122 set to a reference value of the resistance. Alternatively stated, the storage device 122 applies a preset voltage difference between the corresponding word line WL1~WL3 and the ground line GL such that the storage device 122 is set to a reference conductivity value. Then, SET or RESET operation may be performed consequently.

As shown in FIG. 4A, in an embodiment of the present disclosure, during the PRESET process, the voltage V_WL1 of the corresponding word line WL1 is configured to be set at a forming voltage VF while the voltage V_BL1 of corresponding bit line BL1, the voltage V_GL of ground line GL1, and the voltage V_body of the body terminal BD is grounded (i.e., substantially 0V).

In the present embodiment, the storage device 122 is configured to store information by exhibiting changeable, resistance or conductivity. When the storage device 122 (i.e., MIM) is at high resistance state (i.e., with resistance RH) and the voltage across the storage device 122 (i.e., MIM) is sufficient high, the storage device 122 (i.e., MIM) will be set to be in a low resistance state. The output current $I_d$ from the drain terminal D will be changed from low current, that is, the storage device in a low resistance state, to high current, that is, the storage device in a high resistance state.

The SET process is shown in FIG. 4B. As shown in FIG. 4B, in an embodiment of the present disclosure, during the SET process, the voltage V_WL1 of the corresponding word line WL1 is configured to be set at a setting voltage VS while the voltage V_BL1 of corresponding bit line BL1, the voltage V_GL of ground line GL1 and the voltage V_body of the body terminal BD is grounded (i.e., substantially 0V). The storage device 122 receives the setting voltage VS from the corresponding word line WL1 such that the resistance or conductivity is changed to a value representative of the stored information to be written in the storage device 122.

On the other hand, if we want to change the resistivity of the storage device 122 (i.e., MIM) from the low resistance state to the high resistance state, a negative bias is applied on the corresponding word line WL1~WL3 and a positive bias (or zero voltage) is applied on the corresponding bit line BL1~BL3. Then, the output current $I_d$ from the drain terminal D will be changed from high current to low current.

The RESET process is shown in FIG. 4C. As shown in FIG. 4C, during the RESET process, the voltage V_BL1 of the corresponding bit line BL1 and the voltage V_GL of ground line GL1 are configured to be set at a resetting voltage VR while the voltage V_WL1 of the corresponding word line WL1 is grounded and the voltage V_body of the body terminal BD is floating.

Similar to the write operation, in the read operation, in order to read the information from the changing of the resistance of the storage device 122, the corresponding word line WL1~WL3 and the corresponding bit line BL1~BL3 of the target memory unit 120-1~120-12 will be selected, and the source terminal S is grounded, while the body terminal BD of the field-effect transistor 124 may be grounded or back-biased.

According to the stored values, which is represented by the different resistances in the storage device 122 (i.e., MIM), the voltage across the storage device 122 (i.e., MIM) is configured to be changed depending on the high resistance or the low resistance state of the storage device 122. The voltage across the gate oxide dielectric layer of the field-effect transistor 124 is different and then be sensed as an output of the threshold voltage shift or the changes in the output current (i.e., drain current) $I_d$ of the field-effect transistor 124. Alternatively stated, the changed amounts of the output current $I_d$ or the threshold voltage $V_{th}$ of the field-effect transistor 124 represents the reading information, which represents the two-level states (logic zero and logic one).

The storage device 122 applies a reading voltage to the corresponding word line WL1~WL3 and a reading voltage or current between the corresponding bit lines (e.g., BL1 and BL2) to sense the transistor current or voltage in the memory cell such that the resistivity or conductivity is identified via the corresponding bit lines (e.g., BL1 and BL2) and the peripheral circuits.

Figure 5:
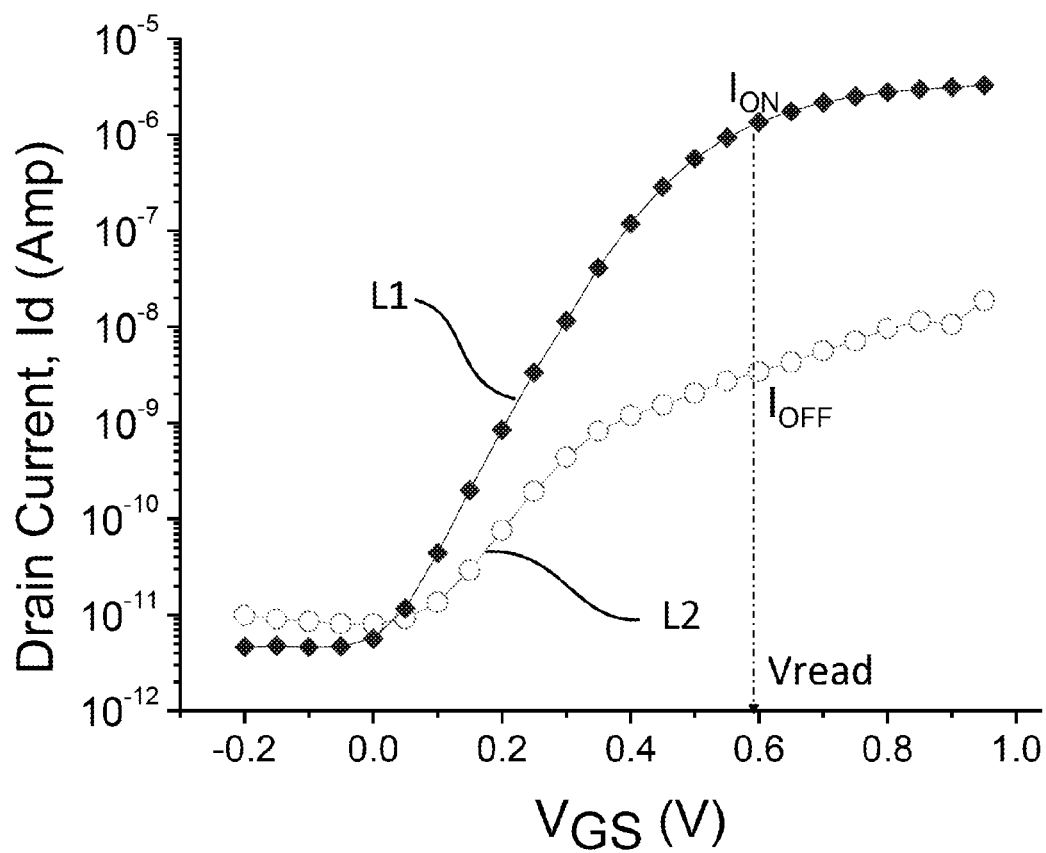
FIG. 5 is a diagram illustrating the drain current characteristics according to an embodiment of the present disclosure.

Reference is made to FIG. 5. FIG. 5 is a diagram illustrating the drain current characteristics according to an embodiment of the present disclosure. In FIG. 5, a curve L1 indicates the voltage-current characteristic of the memory units 120-1~120-12 after applying the SET process. On the other hand, a curve L2 indicates the voltage-current characteristic of the memory units 120-1~120-12 after applying the RESET process.

As shown in FIG. 5, while applying the read voltage $V_{read}$ (e.g., 0.6V), the output current (i.e., drain current) $I_d$ is at a low current level $I_{off}$, representing one logic state (e.g., logic=1) after the RESET process. On the other hand, the output current (i.e., drain current) $I_d$ is at a high current level $I_{on}$, representing another logic state (e.g., logic=0) after the SET process. The above repeated operations perform the function as a memory with non-volatility.

It is noted that in the present embodiment, the voltage $V_{GS}$ represents the voltage between the top electrode TE and the source terminal S. The high current level $I_{on}$ and the low current level $I_{off}$ are the two distinguished current levels of the output current (i.e., drain current) $I_d$ measured from the drain terminal D of the field-effect transistor 124.

Figure 6:
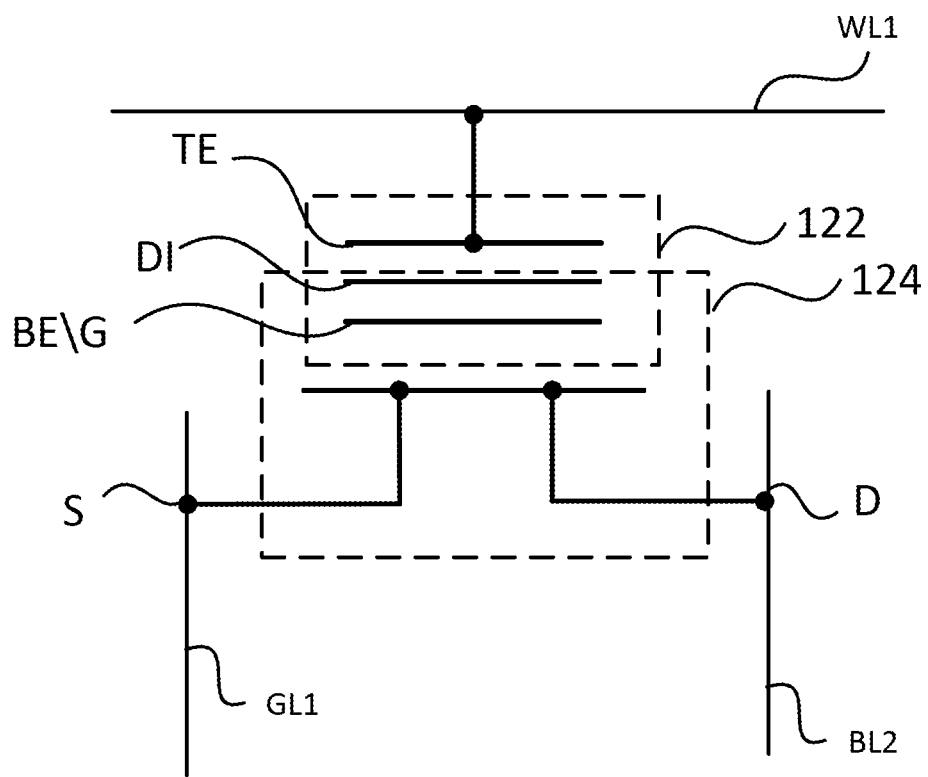
FIG. 6 is a circuit diagram illustrating a memory unit according to another embodiment of the present disclosure.
Figure 7:
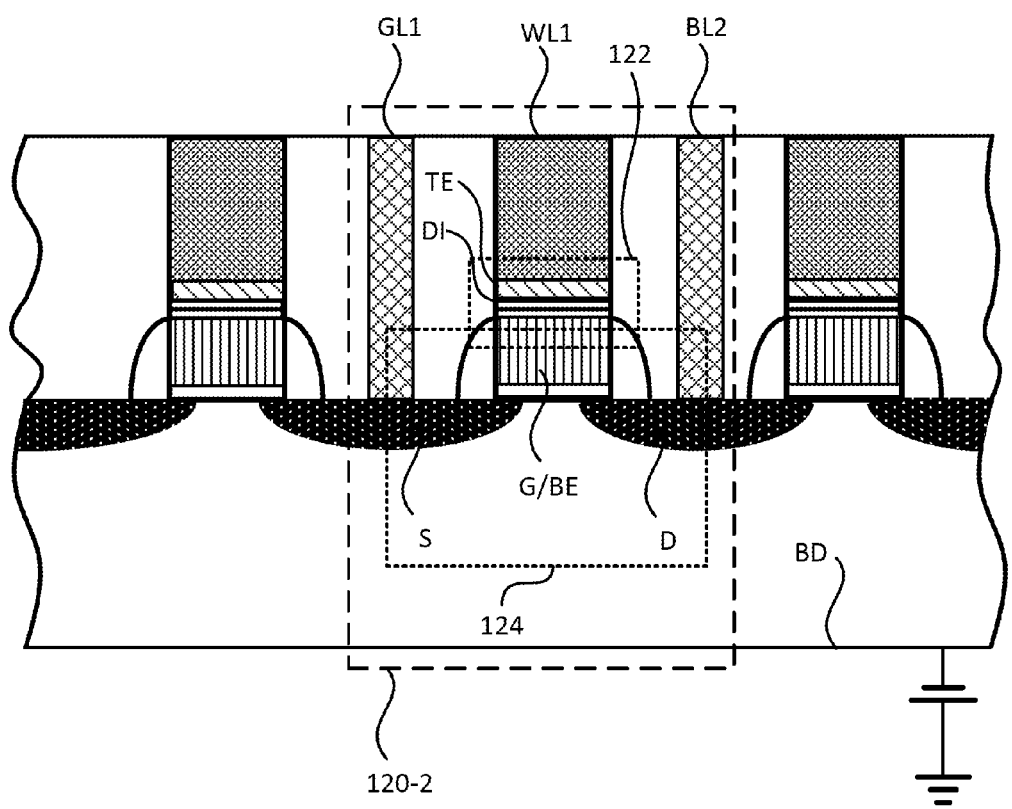
FIG. 7 is a schematic diagram illustrating the structure of memory units according to another embodiment of the present disclosure.

Reference is made to FIG. 6 and FIG. 7. FIG. 6 is a circuit diagram illustrating the memory unit 120-2 according to another embodiment of the present disclosure. FIG. 7 is a schematic diagram illustrating the structure of memory unit 120-2 according to another embodiment of the present disclosure. In the present disclosure, the field-effect transistor 124 and the storage device 122 (i.e., MIM) may share the same metal layer. For example, the bottom electrode BE of the storage device 122 and the gate terminal G of the field-effect transistor 124 share the same metal layer, and the top electrode TE of the storage device 122 is connected to the word line (e.g., WL1), the drain terminal D of the field-effect transistor 124 is connected to the bit line (e.g., BL2), and the source terminal S of the field-effect transistor 124 is connected to the ground line GL. In some embodiment, the body terminal BD of the field-effect transistor 124 is connected to the ground line GL.

Similar to the abovementioned embodiments, although the field-effect transistor 124 may be an n-channel metal-oxide-semiconductor field-effect transistor (an n-channel MOSFET) as shown in FIG. 6 and FIG. 7, it will be understood that the embodiments are not intended to limit the disclosure. It will be apparent to those skilled in the art that the field-effect transistor 124 may also be implemented by other types of field-effect transistor sharing the same metal layer with the storage device 122 (i.e., MIM), such as a p-channel metal-oxide-semiconductor field-effect transistor (p-channel MOSFET), an n-type or a p-type junctionless MOSFET, an electron-conducting tunnel FET, a hole-conducting tunnel FET, or a trigate MOSFET (or FinFET) without limiting the scope or concept of the disclosure.

It is noted that other kinds of transistors, which may be configured by those skilled in the art, may be used according to practical applications and the aforementioned examples are not meant to be limitations of the present disclosure.

The above description includes exemplary operations, but the operations are not necessarily performed in the order described. The order of the operations disclosed in the present disclosure may be changed, or the operations may even be executed simultaneously or partially simultaneously as appropriate, in accordance with the spirit and scope of various embodiments of the present disclosure.

In summary, in the present disclosure, by applying the embodiments described above, a new structure of one transistor one MIM is disclosed to solve the aforementioned issues. The simplicity in the memory structure makes it much easier to be integrated into the current logic CMOS process and be more useful for embedded applications.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory array circuit, comprising:
a plurality of memory units, wherein each of the memory units comprises:
a storage device, comprising:
a top electrode formed by metal or metallic oxide compound or metallic-semiconductor compound connected to a word line;
a bottom electrode formed by metal or metallic oxide compound or metallic-semiconductor compound; and
an oxide-based dielectric formed between the top electrode and the bottom electrode; and
a field-effect transistor, comprising:
a gate terminal connected to the bottom electrode of the storage device;
a source terminal connected to a ground line; and
a drain terminal connected to a bit line;
a channel between the source terminal, the drain terminal, and the gate terminal;
wherein the resistance or conductivity of the storage device is configured to be adjusted according to the differences of voltages between the corresponding word lines, the corresponding bit lines, or the corresponding ground lines connected to memory units.

2. The memory array circuit of claim 1, wherein the storage device is configured to store information by exhibiting changeable resistance or conductivity.

3. The memory array circuit of claim 2, wherein the storage device is configured to apply different writing voltages between the corresponding word line and the corresponding bit line or the corresponding ground line such that the resistance or conductivity is changed to a value representative of the stored information to be written in the storage device.

4. The memory array circuit of claim 2, wherein the storage device is configured to receive a setting voltage source or current source from the word line such that the resistance or conductivity is changed to a value representative of the stored information to be written in the storage device.

5. The memory array circuit of claim 2, wherein the storage device is configured to apply a reading voltage to the corresponding word line and a reading voltage or current between the corresponding bit lines to sense the transistor current or voltage in the memory cell such that the resistivity or conductivity is identified via the corresponding bit lines and the peripheral circuits.

6. The memory array circuit of claim 2, wherein the storage device is configured to be set to a reference conductivity value by applying a preset voltage or current between the corresponding word line and the ground line or the bit line.

7. The memory array circuit of claim 1, wherein the field-effect transistor is an n-channel or a p-channel metal-oxide semiconductor field-effect transistor, an n-channel or p-channel junction-less field-effect transistor, an electron-conducting tunnel field-effect transistor, a hole-conducting tunnel field-effect transistor, or a trigate field-effect transistor.

8. The memory array circuit of claim 1, wherein dielectric capacitance in the field-effect transistor is featured in a combination of $SiO_2$ or SiON or $HfO_2$-based or other high-K gate dielectric layers.

9. The memory array circuit of claim 1, wherein the top electrode and the bottom electrode are formed by at least one layer of a metal or a metallic-oxide compound or a metallic-semiconductor compound formed with metal or semiconductor or oxygen in the form of oxygen ions or oxygen vacancies or metal ions.

10. The memory array circuit of claim 9, wherein the oxide-based dielectric layer is configured to change the stored value by moving ions or vacancies in dielectric when voltage or current is applied on the storage device.

11. The memory array circuit of claim 9, wherein the oxide-based dielectric layer comprises at least one layer of oxides or semiconductor-oxide compounds or metallic oxide compounds or metallic semiconductor-oxide compounds which changes conductivity by moving ions or vacancies as voltage or current is applied.

12. The memory array circuit of claim 1, wherein the bottom electrode of the storage device and the gate terminal of the field-effect transistor share the same metal layer.

13. A memory array circuit, comprising:
a plurality of word lines;
a plurality of bit lines;
a word line driver connected to the word lines;
a bit line driver connected to the bit lines;
a ground line; and
a plurality of memory units, wherein each of the memory units comprises:
a storage device, comprising:
    a top electrode formed by metal or metallic oxide compound or metallic semiconductor compound connected to the corresponding word line;
    a bottom electrode formed by metal or metallic oxide compound or metallic semiconductor compound; and
    an oxide-based dielectric layer formed between the top electrode and the bottom electrode; and
a field-effect transistor, comprising:
    a gate terminal connected to the bottom electrode of the storage device;
    a source terminal connected to the corresponding ground line; and
    a drain terminal connected to the corresponding bit line;
    a channel between the gate terminal, the source terminal and the drain terminal;
    wherein the resistance of the storage device is configured to be adjusted according to the differences of voltage between the corresponding word line, the corresponding bit line, or the corresponding ground line.

14. The memory array circuit of claim 13, wherein the storage device is configured to store information by exhibiting changeable resistance or conductivity.

15. The memory array circuit of claim 14, wherein the storage device is further configured to apply a writing voltage or current between the corresponding word line and the corresponding bit line or the corresponding ground line such that the resistivity or conductivity is changed to a value representative of the stored information to be written in the storage device.

16. The memory array circuit of claim 14, wherein the storage device is further configured to receive a setting voltage source or current source from the word line such that the resistance or conductivity is changed to a value representative of the stored information to be written in the storage device.

17. The memory array circuit of claim 14, wherein the storage device is further configured to apply a reading voltage to the corresponding word line and a reading voltage to the corresponding bit lines to sense the transistor current or voltage in the memory cell such that the resistance or conductivity is identified via the corresponding bit lines and the parasitic circuits.

18. The memory array circuit of claim 13, wherein the storage device is configured to be set to a reference conductivity value by applying a preset voltage or current between the corresponding word line and the ground line or the bit line.

19. The memory array circuit of claim 13, wherein the top electrode and the bottom electrode are formed by at least one layer of a metal or a metallic-oxide compound or a metallic-semiconductor compound formed with metal or semiconductor or oxygen in the form of oxygen ions or oxygen vacancies or metal ions, and the oxide-based dielectric layer is configured to change the stored value by moving ions or vacancies in dielectric as voltage differences or current differences applied on the storage device.

20. The memory array circuit of claim 19, wherein the oxide-based dielectric layer comprises at least one layer of oxide compounds or metallic oxide compounds or metallic semiconductor-oxide compounds which changes conductivity by moving ions or vacancies as voltage or current is applied.

21. The memory array circuit of claim 13, wherein the bottom electrode of the storage device and the gate terminal of the field-effect transistor share the same metal layer.

* * * * *